(12) United States Patent  
Wang (10) Patent No.: US 6,499,777 B1
(45) Date of Patent: Dec. 31, 2002

(54) END-EFFECTOR WITH INTEGRATED COOLING MECHANISM

(75) Inventor: Albert Wang, Moraga, CA (US)

(73) Assignee: Matrix Integrated Systems, Inc., Richmond, CA (US)

( * ) Notice: Subject to any disclaimer, the term of this patent is extended or adjusted under 35 U.S.C. 154(b) by 0 days.

(21) Appl. No.: 09/565,833

(22) Filed: May 5, 2000

Related U.S. Application Data
(60) Provisional application No. 60/133,568, filed on May 11, 1999.

(51) Int. Cl.⁷ .............................................. B65G 49/07
(52) U.S. Cl. .................... 294/1.1; 414/225.01; 414/935; 414/936; 414/937; 414/940; 414/941; 118/728; 165/80.2; 901/31
(58) Field of Search ................................ 294/1.1, 27.1, 294/32, 902, 64.1–64.3; 414/935–941, 222.1, 222.01, 222.12, 222.13, 225.01, 744.1; 118/724, 725, 728, 729; 34/62, 66, 428, 443, 68, 72, 75, 429, 430, 433; 62/3.2, 62; 901/30, 31, 27, 50; 165/80.1–80.3; 156/345

(56) References Cited

U.S. PATENT DOCUMENTS

| | | | | |
|---|---|---|---|---|
| 4,670,396 A | * | 6/1987 | Bear et al. .................. 435/285 |
| 4,811,493 A | | 3/1989 | Burgio, Jr. ......................... 34/4 |
| 4,863,547 A | | 9/1989 | Shidahara et al. .......... 156/345 |
| 4,868,996 A | | 9/1989 | Ohmori et al. ................. 34/13 |
| 5,080,549 A | | 1/1992 | Goodwin et al. ......... 414/744.8 |
| 5,318,801 A | | 6/1994 | Snail et al. ............... 427/248.1 |
| H1378 H | * | 11/1994 | Crane et al. ................. 414/737 |
| 5,443,997 A | | 8/1995 | Tsui et al. ................... 437/225 |
| 5,520,742 A | | 5/1996 | Ohkase ........................ 118/724 |
| 5,628,121 A | | 5/1997 | Brooks et al. .................. 34/61 |
| 5,746,460 A | | 5/1998 | Marohl et al. ............... 294/1.1 |
| 5,778,968 A | | 7/1998 | Hendrickson et al. ........ 165/80 |
| 5,882,165 A | | 3/1999 | Maydan et al. ............. 414/217 |
| 5,911,837 A | | 6/1999 | Matthews ....................... 134/2 |
| 5,915,915 A | | 6/1999 | Allen et al. .............. 414/744.1 |
| 5,937,541 A | | 8/1999 | Weigand et al. ............... 34/565 |
| 5,970,717 A | | 10/1999 | Tateyama ..................... 62/3.2 |
| 5,974,682 A | | 11/1999 | Akimoto ........................ 34/66 |
| 6,000,227 A | | 12/1999 | Kroeker ......................... 62/62 |
| 6,073,366 A | * | 6/2000 | Aswad ........................ 34/367 |

FOREIGN PATENT DOCUMENTS

| | | |
|---|---|---|
| JP | 03138369 | 6/1991 |
| JP | 03224236 | 10/1991 |
| JP | 04176121 | 6/1992 |
| JP | 07045536 | 2/1995 |

* cited by examiner

Primary Examiner—Christopher J. Novosad
(74) Attorney, Agent, or Firm—Knobbe, Martens, Olson & Bear LLP (57) ABSTRACT

An end-effector with integrated cooling features comprises heat transferring mechanisms that transfer heat energy away from the end-effector. The end-effector advantageously minimizes the cooling overhead of a processed substrate as it is transported from a process module to a low-cost storage cassette. The reduced cooling overhead of the processed substrate, as a consequence, improves substrate throughput. In the preferred embodiments, the heat transferring mechanisms include a high surface area heat sink connecting the substrate-supporting paddle with a robot arm. Cooling fins can enhance surface area and thus enhance heat dissipation from the heat sink. Cooling channels can extend through paddle and heat sink, either containing circulating fluid for carrying heat beyond the end-effector or a phase changing material in an enclosed heat pipe.

22 Claims, 7 Drawing Sheets

END-EFFECTOR WITH INTEGRATED COOLING MECHANISM

REFERENCE TO RELATED APPLICATION

The present application claims the priority benefit under 35 U.S.C. §119(e) from provisional Application No. 60/133,568 of Albert Wang, filed May 11, 1999.

FIELD OF THE INVENTION

The invention relates generally to robots for handling semiconductor substrates during fabrication, and more particularly to end-effectors for transferring substrates into and out of high temperature process chambers.

BACKGROUND OF THE INVENTION

Some semiconductor processes are conducted at elevated wafer temperatures to achieve a desired process result. Semiconductor substrates or wafers are heated up inside the process chamber such as by direct physical contact with a heated wafer chuck or by radiation from radiant heating sources. As the process completes, it is advantageous to cool the processed wafers before placing them back in a wafer cassette. Without cooling, hot wafers may damage cassettes, such that more expensive hightemperature cassettes would be required to hold hot wafers. Additionally, the cassettes may not be safe for workers to handle.

Traditionally, hot wafers are cooled with a stand-alone wafer cooling station. A robot picks a hot wafer from the process chamber and places it on the wafer cooling station, where the wafer is allowed to cool down before being placed in the cassette. Water circulates through channels or tubes inside the cooling station to remove heat drawn from the wafer, thereby keeping the station cool enough to continue drawing heat from subsequent wafers.

Using a stand-alone wafer cooling station to cool hot wafers requires an additional wafer pick-and-place motion and a waiting period for the wafer-to-station heat transfer to complete, representing process overhead. This overhead may not lower the equipment throughput if the time required to complete a particular process is long enough and the robot is fast enough that the robot is always waiting for the process chamber to be ready for the next wafer. However, this overhead can cause a significant throughput reduction if the process is short enough that the process chamber is waiting for the robot to complete wafer transfer.

In the semiconductor industry, photoresist ashing or stripping is one of the short processes in which this type of wafer handling overhead can dramatically lower the overall throughput of the resist stripping reactor. Moreover, as process technology improves and processing speeds increase, cooling time can become a limiting factor for wafer throughput in other integrated circuit fabrication steps.

Accordingly, there is a need to minimize the wafer cooling overhead resulting from integrated circuit fabrication steps.

SUMMARY OF THE INVENTION

In satisfaction of this need, robot end-effectors are disclosed for minimizing cooling overhead of processed wafers between stations is disclosed. Means for transporting a wafer between processing stations is provided with heat transferring mechanisms.

In accordance with one aspect of the invention, an end-effector is provided for transporting substrates within a semiconductor fabrication environment. The end-effector includes a paddle portion that is configured to underlie at least 60% of a substrate to be processed, and thereby support and conductively exchange heat with the substrate. A handle portion is integrally formed with the paddle portion and is configured to connect the paddle portion to a robot arm. The end-effector also includes an integrated cooling mechanism configured to dissipate heat from the end-effector by convection.

The cooling mechanism of one embodiment includes a plurality of fins extending from the handle portion and providing a high surface area for heat dissipation. As the end-effector moves, air flows through the fins to force convection without introducing more particles into the processing environment. In another embodiment, cooling fluid channels are provided in the end-effector to carry heat by convection from the paddle region to the handle portion and/or from the handle portion outside the end-effector. The channels can be closed heat pipes house phase transition fluid or open loop channels for circulating coolant fluid.

In accordance with another aspect of the invention, a method is provided for cooling and transferring processed substrates with a dual arm robot. The method includes picking up a first hot substrate with a first end-effector and transferring heat from the first hot substrate to the first end-effector. The first hot substrate is moved to storage cassette with the first end-effector. A second hot substrate is picked up with a second end-effector and heat is transferred from the second hot substrate to the second end-effector. The first end-effector is cooled in the interim. The second hot substrate is moved to a second storage cassette with the second end-effector.

In the preferred embodiment, cooling is conducted by picking up a first cold substrate from a cassette with the first end-effector after dropping the first hot substrate and carrying it to a process chamber. Preferably, each of the two end-effectors alternately pick up hot substrates, such that while one end-effector carries a hot substrate, the other end-effector is allowed to cool, particularly by transferring heat to a cold substrate. Most preferably, the end-effectors include one or more cooling mechanisms as described with respect to the first aspect described above.

In accordance with another aspect of the invention, a method is provided for handling substrates between a storage area and a high temperature processing chamber. The method includes removing a processed substrate from a high temperature processing chamber with a substrate handler. The substrate handler includes a paddle portion in thermal contact with a handle portion, and the handle portion connects the paddle portion to a robot arm. Heat transfers conductively from the substrate to the paddle portion. This heat is, in turn, transferred from the paddle portion to the handle portion. Heat is then actively dissipating heat from the handle portion by forced convection.

BRIEF DESCRIPTION OF THE DRAWINGS

These and other aspects of the invention will be appreciated from the detailed description of the preferred embodiments below, and from the appended drawings, which are meant to illustrate and not to limit the invention.

DETAILED DESCRIPTION OF THE PREFERRED EMBODIMENTS

The preferred embodiments provide improved cooling of processed wafers in the transport period between process chambers and storage cassettes, thereby improving wafer throughput by reducing wafer cooling overhead. While the term "wafer" is employed herein, the skilled artisan will readily appreciate that the end-effector and robot arrangements described herein are readily applicable to handling a variety of other substrates or workpieces, such as glass substrates for flat panel displays.

Cooling hot wafers during wafer transfer has the potential to completely eliminate the wafer cooling overhead, thereby maximizing wafer throughput. Accordingly, the preferred embodiments provide mechanisms for rapidly exchanging heat with wafers as they are the carried on a wafer paddle. In particular, a variety of wafer paddles or end-effectors are provided for wafer handling robots.

Rapid cooling is particularly advantageous in the context of photoresist ashing reactors. For example, wafer temperatures after photoresist stripping processes typically range between about 220° C. and 250° C. Presently, cooling the wafers to the temperature range at which they can be safely placed in a typical cassette is particularly slow. Processed wafers are generally cooled in intermediate steps, such as placement on offline cooling stations, which require additional robot steps and consequently longer transfer time. Moreover, cooling stations and the additional steps entailed by them pose a greater opportunity for particulate generation in the controlled reactor atmosphere.

It would be particularly advantageous for a processed wafer to be cooled without slow intermediate steps. For example, cooling a wafer in the period it takes for a processed wafer to be transported between a process chamber and a storage cassette would be ideal. The reduction of cooling overhead would, as a consequence, improve wafer throughput.

One way of cooling the processed wafer during transport is to blow cold air or nitrogen directly on the hot wafer while it is in motion. Such a solution, however, can cause wafer handling problems and particulate contamination of the well-controlled process environment, which includes the process chambers, wafer-handling chamber, and loadlock chamber.

Generally, an end-effector attached to a robot arm mechanically transports semiconductor workpieces (e.g., silicon wafers, glass substrates) between different process chambers, and/or between process chambers and storage cassettes.

In the illustrated embodiments, therefore, wafer handling end-effectors with high thermal capacity serve to control the wafer temperature. Advantageously, the arrangement facilitates rapid transfer of heat from a hot wafer (removed from a process chamber) to the end-effector, thus cooling processed wafers. The same structures allow heat transfer from the end-effector to a cold wafer (from a storage cassette), thus preheating unprocessed wafers. Furthermore, structures are provided for dissipating heat from the end-effector. A temperature gradient between subsequent hot wafers and the end-effector is thus maintained and subsequent processed wafers are also cooled.

Figure 1:
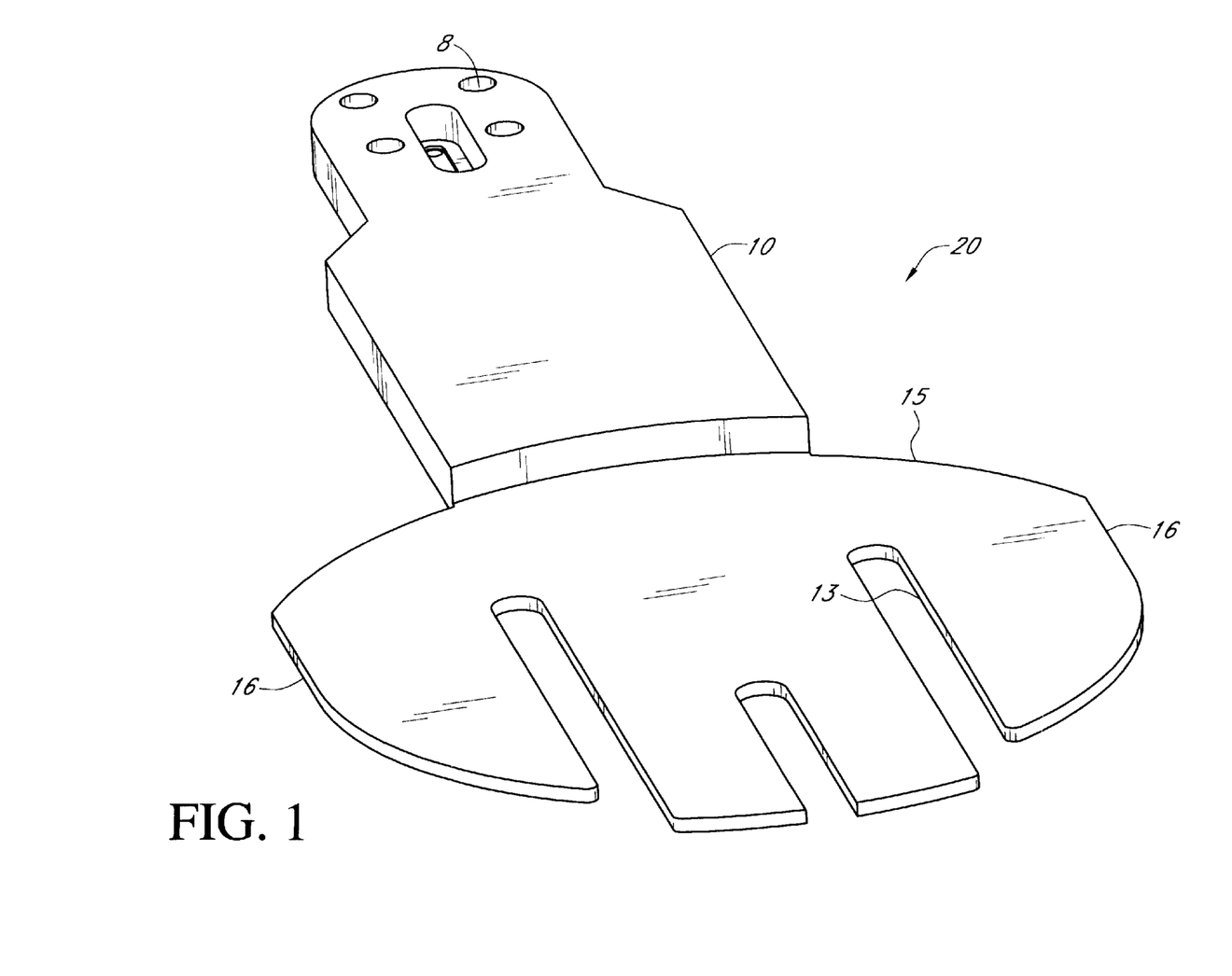
FIG. 1 is a schematic top and left perspective view of an end-effector, for purposes of generally discussing the structures and methods of the preferred embodiments, shown in more detail in the following figures.

Referring to FIG. 1, a robot end-effector 20 is shown with a heat sink or dissipating portion 10, also referred to herein as a handle portion, and an integral wafer support or paddle portion 15. It will be understood that, the "integral" paddle portion 15 can be provided as a separate but fixedly attached piece. The heat sink portion 10 preferably connects the paddle portion 15 to a robot arm (not shown) by way of bolt holes 8. The paddle 15 is the portion of the end-effector 20 that supports a wafer (not shown) during transfer. The illustrated heat sink portion 10 is directly adjacent to and partially defines the supporting paddle portion 15.

Slots 13 on the paddle portion 15 preferably accommodate wafer lift pins (not shown) to either lift the wafer from the end-effector 20 for processing in a process chamber, or to drop the wafer on the end-effector 20 for transfer out of a process chamber. It will be understood, however, that mechanisms other than the lift pins and slots can facilitate transfer from the wafer support or chuck to the end-effector.

The preferred end-effectors serve as heat conduits. The paddle portion 15, which contacts the wafer and exchanges heat therewith (extracting heat from or providing heat to the wafer), serves as a first heat exchanger. The heat sink portion 10, which is in thermal contact with the paddle portion 15, serves as a second heat exchanger. In a cooling mode, the heat sink 10 receives heat energy from the paddle portion 15 and dissipates heat to the surroundings. It will be understood, of course, that the heat exchange can be bi-directional, i.e., heat can be removed from or added to the end-effector 20, depending upon the relative temperatures of the wafer and the end-effector 20.

Cooling can be achieved when an initial "cold" end-effector 20 makes direct contact with a "hot" processed wafer, and thermal equilibrium is subsequently reached. It will be understood that the term "cold" is a relative term that compares the temperature of the end-effector 20 relative to the temperature of the processed wafer (hot), and thus the term "cold" as used herein can signify temperatures warmer than room temperature. Similarly, the end-effector 20 is considered "hot" when a relatively cooler wafer is placed thereon. Accordingly, when the processed wafer and the end-effector 20 reach thermal equilibrium, the temperature of the processed wafer could be low enough for it to be safely placed in a storage cassette.

Advantageously, the heat sink portion 10 has a relatively high surface area to facilitate dissipation. The width of the heat sink 10 is preferably greater than one-quarter of the width of the paddle portion 15, more preferably one-quarter to one-half the width of the paddle 15, while the length of the heat sink is preferably one-half to 1.5 times the length of the paddle portion 15. The upper surface area of the heat sink 10 is thus preferably at least about one-quarter the upper surface area of the paddle portion 15. As set forth below, the surface area of the paddle portion 15 is slightly smaller than that of the wafer to be supported, such that the heat sink 10 has an upper surface area about one-third to two-thirds that of the wafer. In the illustrated embodiment, the heat sink 10 is about 3 inches wide and 7 inches in length, where the end effector is configured to support wafers with a diameter of about 8 inches. The relative surface areas discussed above compare upper surfaces of the different portions and excludes any surface area enhancement from features such as the fins of FIG. 2, discussed below.

The ratio of thickness of the heat sink portion 10 to the paddle portion 15 is greater than about 2:1, more preferably greater than about 3:1, and is between about 3:1 and 4:1 in the illustrated embodiment. The greater thickness aids in drawing heat from the paddle portion 15 while also facilitating formation of heat dissipation mechanisms within the heat sink 10.

Heat transfer from a processed wafer to the end-effector 20 can be facilitated by contact between the wafer and the end-effector 20, particularly at the paddle 15 where the wafer is seated. In contrast to many end-effector designs, whereby contact between the end-effector and the wafer is minimized, the preferred embodiments seek to maximize contact. Maximizing the area of the paddle portion 15 configured to underlie and support the processed wafer size increases the rate of heat transfer by conduction. Accordingly, the area of the paddle portion 15 should be as large as possible without interfering with the wafer storage cassette during placement or removal of the wafer. Preferably, the paddle portion 15 is substantially the same width (e.g., 85%–110%) as the largest wafer meant to be handled (e.g., 8 inch or 200 mm wafers) and substantially the same length. Accounting for the slots 13 reducing the surface area of contact, the support surface defined by the paddle portion 15 represents greater than about 60% and more preferably greater than about 80% of the surface area of the wafer. In the illustrated embodiment, the paddle portion 15 has a width of 7 inches and a length of 8 inches and is configured for supporting 8 inch wafers. The illustrated paddle portion 15 has the shape of an 8 inch (200 mm) wafer to be supported except for half-inch truncations 16 at either side.

Minimizing the gap between the processed wafer and the paddle portion 15 can increase the rate of heat transfer by conduction. Accordingly, the wafer can be held or clamped to the end-effector 20 by any suitable means, particularly by vacuum or electrostatic force. Both types of clamping provide a uniform clamping force that maximizes the wafer/end-effector 20 contact area, thereby maximizing the rate of heat transfer by conduction therebetween.

The thermal capacity of the material chosen for the end-effector 20 can also affect the final wafer temperature. Assuming no heat transfer to the surroundings, the following energy equation can realize the final wafer temperature after thermal equilibrium is reached between the wafer and the wafer support 15:

$$m_e \times C_{pe} \times (T_f - T_e) = m_w \times C_{pw} \times (T_w - T_f) \quad (1)$$

where:

$m_e$=mass of the paddle portion 15, $C_{pe}$=material specific heat constant of the paddle portion 15, $T_f$=final temperature of both the wafer and paddle portion 15 as thermal equilibrium is reached, $T_e$=initial temperature of paddle portion 15, $m_w$=mass of wafer, $C_{pw}$=material specific heat constant of wafer; and $T_w$=initial wafer temperature.

Equation (1) states that the energy removed from the wafer equals the energy received by the paddle portion 15. It also implies that the larger the thermal capacity of the paddle portion 15 ($m_e \times C_{pe}$), the lower the final temperature ($T_f$) of the wafer.

It is an aspect of the present embodiment to provide an improved wafer cooling means that reduces cooling overhead between process chambers and storage cassettes. A cooling mechanism integrated with an end-effector facilitates heat dissipation from the end-effector, eliminating the need for an additional cooling step, such as a cooling station, and thereby reducing the transport time it takes for a processed wafer to be safely placed in a storage cassette.

Figure 2:
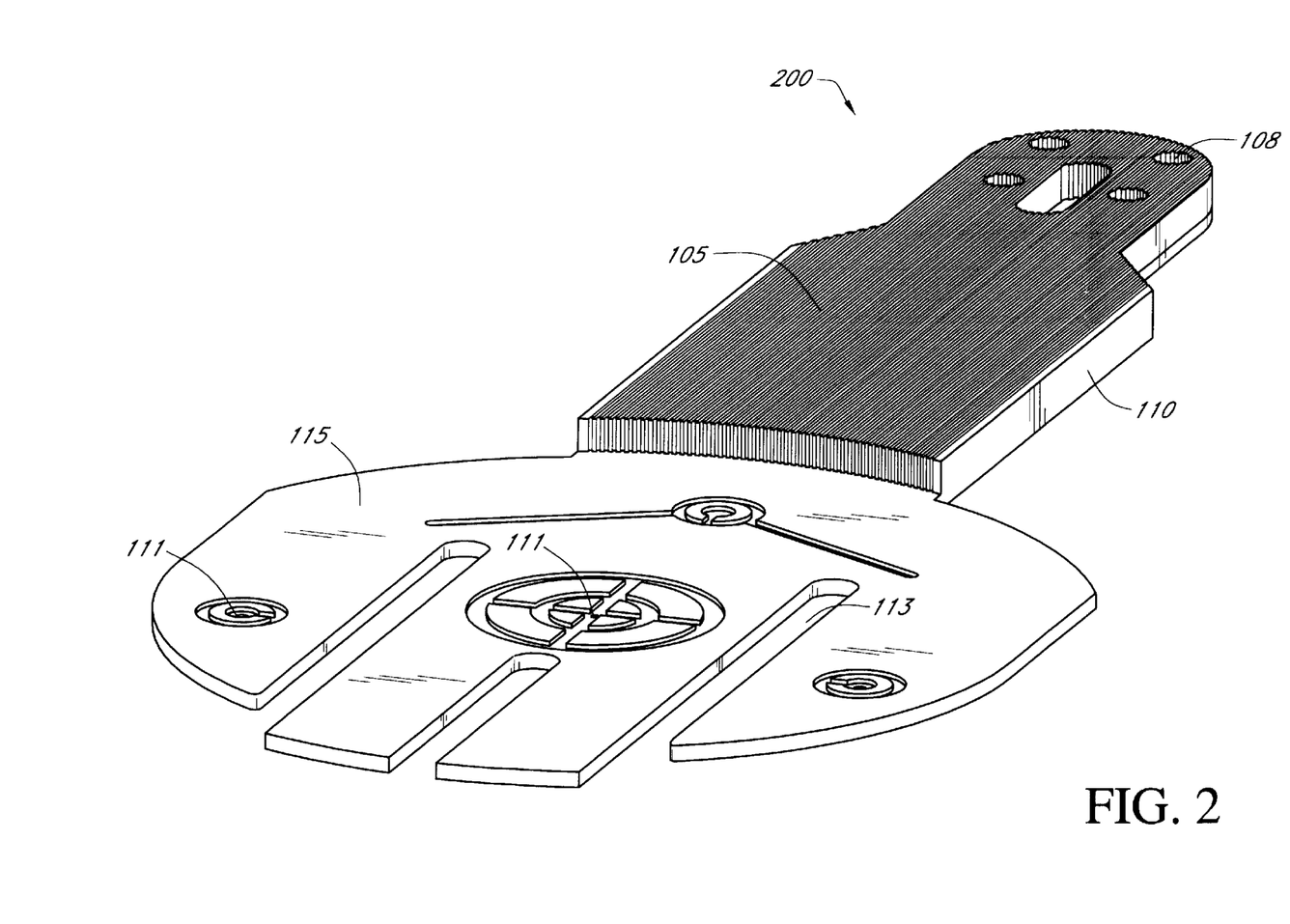
FIG. 2 is a top and right perspective view of an end-effector constructed in accordance with a preferred embodiment of the present invention.

FIG. 2 shows an end-effector 100 constructed in accordance with a preferred embodiment. The end-effector 100 comprises a heat sink or heat dissipater 110 with a plurality of attachment holes 108, and a paddle portion 115 with slots 113 and vacuum ports 111. The vacuum ports 111 preferably clamp the wafer to the paddle portion 115 by vacuum suction. The skilled artisan will readily appreciate that other clamping means could be used to secure a wafer on the end-effector 100, such as electrostatic force. The vacuum suction ports 110 facilitate intimate contact between the paddle portion 115 and the wafer for improved heat transfer by conduction. Vacuum channels (not shown) are formed on the back or underside of the paddle portion 115. For example, such channels can be machined as grooves in the underside of the paddle portion 115, with caps covering the grooves to complete the vacuum channels or with tubes bonded within the grooves.

Preferably, the end-effector 100 is made of a thermally conductive material such as metal. In the illustrated embodiment, the thermally conductive material is preferably an aluminum alloy that comprises a high thermal capacity. In particular, the paddle portion 115 that extends from the handle or heat sink 110 is preferably also constructed of aluminum alloy and preferably comprises a thickness between about 0.05 inches and 0.20 inches, more preferably between about 0.110 inches and 0.120 inches (for carrying 200 mm wafers). The thermal capacity of the paddle portion is thus preferably greater than about 100 Joule/° C., more preferably greater than about 180 Joule/° C. For the illustrated embodiment, the thermal capacity of the paddle portion 115 is preferably around 197 Joule/° C. In other arrangements, a more massive paddle portion will even more rapidly draw heat, initially, from hot wafers.

As previously noted, the paddle portion 115 serves as a first heat exchanger, exchanging heat with the wafer. In the illustrated embodiment, the heat sink or dissipation mechanism 110 is thicker than the paddle portion 115, preferably more than twice as thick. The thicker heat sink 110 advantageously enables greater absorption of heat from the paddle portion 115. The heat sink 110 thus serves as a second heat exchanger, drawing heat from the paddle portion 115.

An exemplary analysis using the above energy transfer equation (1) can be calculated involving the end-effector 100 of FIG. 2 (Heat Capacity=197 Joule/° C.) and silicon wafers comprising a general heat capacity of about 39 Joule/° C. For example, the end-effector 100 that is at an initial ambient temperature (about 20° C.) picks up a first processed wafer (at about 200° C.) from a process chamber. From the above equation (1), both the end-effector 100 and processed wafer reaches a final thermal equilibrium temperature of about 49.7° C. After placing the first processed wafer safely in a storage cassette, the end-effector 100 subsequently reaches for a second "cold" wafer (~20° C.) from the storage cassette to be transported to the process chamber. A final thermal equilibrium temperature of about 44.8° C. is reached for both the end-effector 100 and the second wafer.

The above cycle repeats when the end-effector 100 places a "cold" wafer in the process chamber after having just placed a processed wafer into the storage cassette. Assuming that there is no heat loss to the surrounding environment, the alternating heat exchanges between the end-effector 100 and the series of wafers result in a steady state cooled wafer temperature of about 118.9° C. after the loading, processing and unloading of about 18 wafers.

It should be generally understood that the above exemplary analysis is calculated under the assumption that the paddle portion 115, cold wafers and hot wafers form a closed system, and that the system is allowed to reach thermal equilibrium between steps. Thus, the above calculations are made with no consideration for the reality that heat will be lost from the end-effector/wafer combination to the environs, to say nothing of the improved thermal transfer to the environs due to the integrated cooling fins 105, discussed in detail below.

It will be readily appreciated that the wafer cooling responses will vary according to the end-effector 100 characteristics. For example, with reference to FIG. 6, a graph plots three asymptotic curves demonstrating steady state temperatures of a series of 25 wafers. Each of the three curves plot the cooling response of the series of wafers with respect to varying material thermal capacities of end-effector 100 (C=197 Joules/° C., C=250 Joules/° C., C=300 Joules/° C.). The asymptotic curves are plotted from calculated data using equation (1), with the assumption that there is no heat loss between the wafer/end-effector 100 system and its surroundings.

Figure 6:
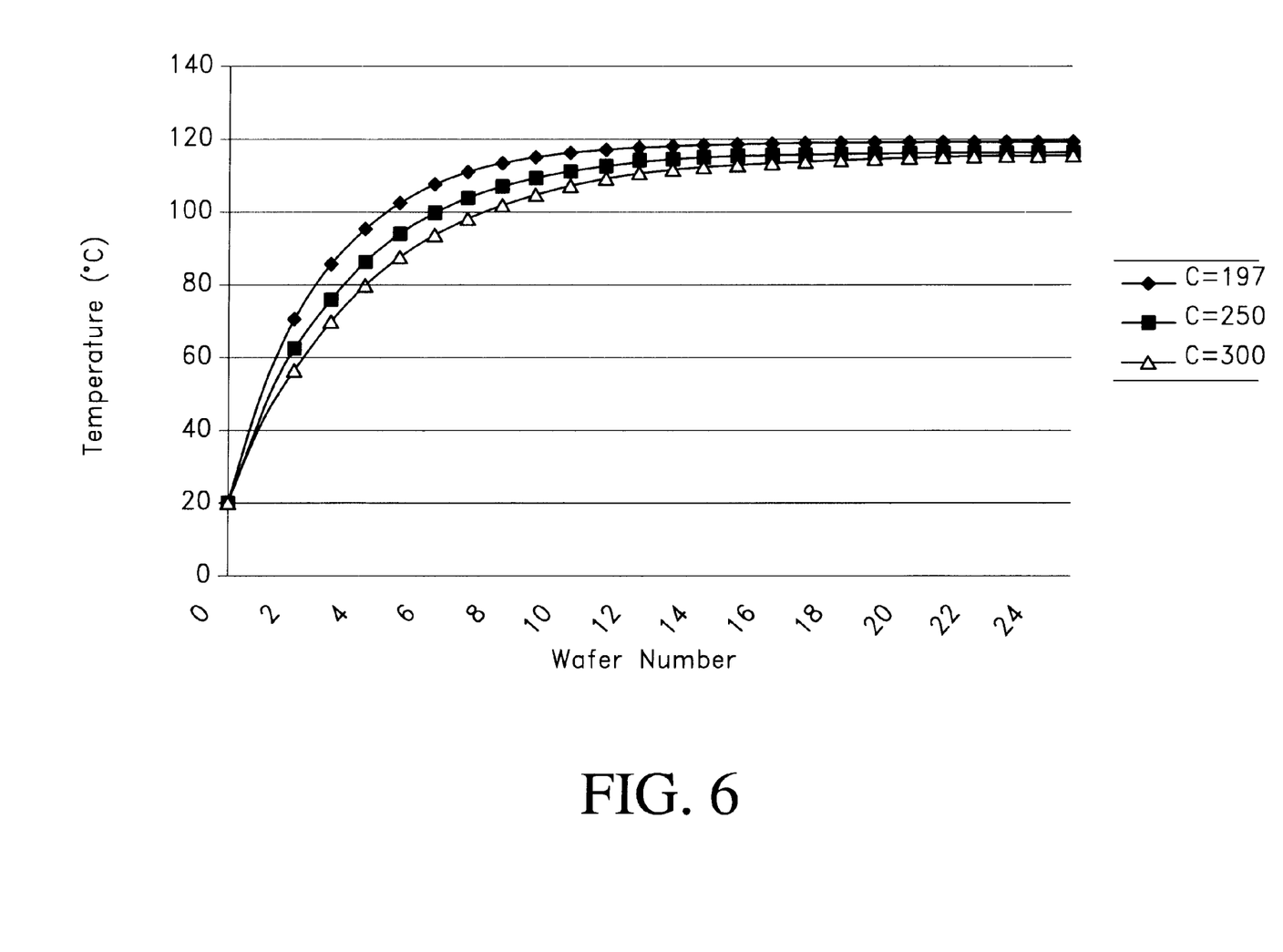
FIG. 6 is a graph plotting wafer temperature against number of wafers processed for end-effectors having three different thermal capacities.

As the skilled artisan will appreciate from the graph, the larger the thermal capacity of the end-effector 100, the lower the steady state temperature of the wafer series and, also, the longer it takes to reach steady state temperature. Accordingly, for a thermal capacity of 250 Joules/° C., the wafer/end effector 100 system reaches a steady state temperature of about 116.3° C. after processing about 22 wafers. For a thermal capacity of 300 Joules/° C., the wafer/end-effector 100 system reaches a steady state temperature of about 115.2° C. after processing about 24 wafers.

To further increase the thermal capacity of the end-effector 100, one can increase the average coverage (e.g., by downsizing or eliminating the slots 113 for the wafer lift pins) and/or thickness of the end-effector 100, either of which would increase the end-effector's mass. The illustrated paddle portion 115 has a thickness of about 0.115 inches. In other arrangements, a paddle for transporting 300-mm wafers can have a thickness of greater than about 0.130 inches. One can also change the end-effector 100 material, since the thermal capacity is directly related to the density (mass) and the specific heat of the end-effector 100 material. However, there are practical limits on increasing these dimensions. For example, the spacing between slots in a standard wafer storage cassette effectively limits the thickness of the wafer support 115, which inserts wafers in the cassette. For 8-inch (200 mm) wafers, this spacing is typically about 0.25 inches. Additionally, a more massive end-effector can absorb more heat from sequentially processed and transferred wafers, but dissipation of this heat is more difficult.

The illustrated end-effector 100 also comprises surface-increasing structures or projections in the form of cooling fins 105. Preferably, the upper surface area of the heat sink 110 (i.e., the surface area of the fins 105) is more than two times the surface area of the paddle portion 115, more preferably between three times and four times the paddle portion 115 upper surface. This also means the heat sink 110 has a surface area more than 2.5 times that of the wafer upper surface. The cooling fins 105 advantageously catalyze heat transfer by conduction between the paddle portion 115 and the heat sink 110 by enhancing heat dissipation from the heat sink 110. Heat dissipation lowers the temperature of the heat sink 110 such that a temperature gradient is maintained between the heat sink 110 and the paddle portion 115. Due to the temperature gradient, heat energy that is absorbed by the paddle portion 115 wafers transferred thereupon more readily flows to the heat sink 110.

The cooling fins 105 can be designed with varying dimensions to meet different heat dissipation requirements. Generally, the cooling fins 105 should be designed with a maximum surface area that will more readily dissipate heat to atmosphere from the end-effector 100. Also, as the end-effector 100 transports the processed wafer from the process chamber to the storage cassette, its motion will further enhance cooling of the cooling fins 105 by forced convection without introducing particulates. On the other hand, cooling by natural convection resumes when the end-effector 100 is stationary.

In the preferred embodiment, the cooling fins 105 comprise fins with a width preferably between about 0.025 inches and 0.035 inches. The thickness or height of the cooling fins 105 above the horizontal plane of the paddle portion 115 is preferably between two to four times the thickness of the paddle portion of 115. The spacing between each cooling fin is preferably between about 0.025 inches and 0.035 inches.

The cooling fins 105 of the preferred embodiment advantageously promote convective cooling of the end-effector 100, which in turn preferably cools a processed wafer from about 250° C. to less than about 140° C., more preferably to less than about 120° C. within about 5 seconds. The processed wafer is thus cooled in the time that it takes for the end-effector 100 to transport a hot wafer directly from the process chamber to the storage cassette without any further cooling overhead. In the illustrated embodiment, a wafer can be cooled from 250° C. to less than 100° C. in 5 seconds or less.

Conventional robots have a single arm and single end-effector. Typically, it takes about five seconds for the robot to pick a hot wafer from the process chamber and place it in the wafer cassette, another five seconds to pick a cold wafer and place it in the chamber. The entire wafer transport cycle consists of two pick-and-place steps and takes around 10 seconds. Tests show that the heat transfer between the wafer and the paddle portion 115 takes about 3 seconds. The wafer temperature did not reach true or final equilibrium, but was in the asymptotic region.

More recently, dual arm robots have gained wide acceptance in the industry. They offer almost twice the wafer transfer throughput as that of single arm robots. Typically, dual arm robots are configured so that one arm always transfers hot wafers while the other arm always transfers cold wafers. In such an arrangement, the cooling mechanisms of the present disclosure need only be applied to the hot wafer handler of the dual arm robot.

Figure 7:
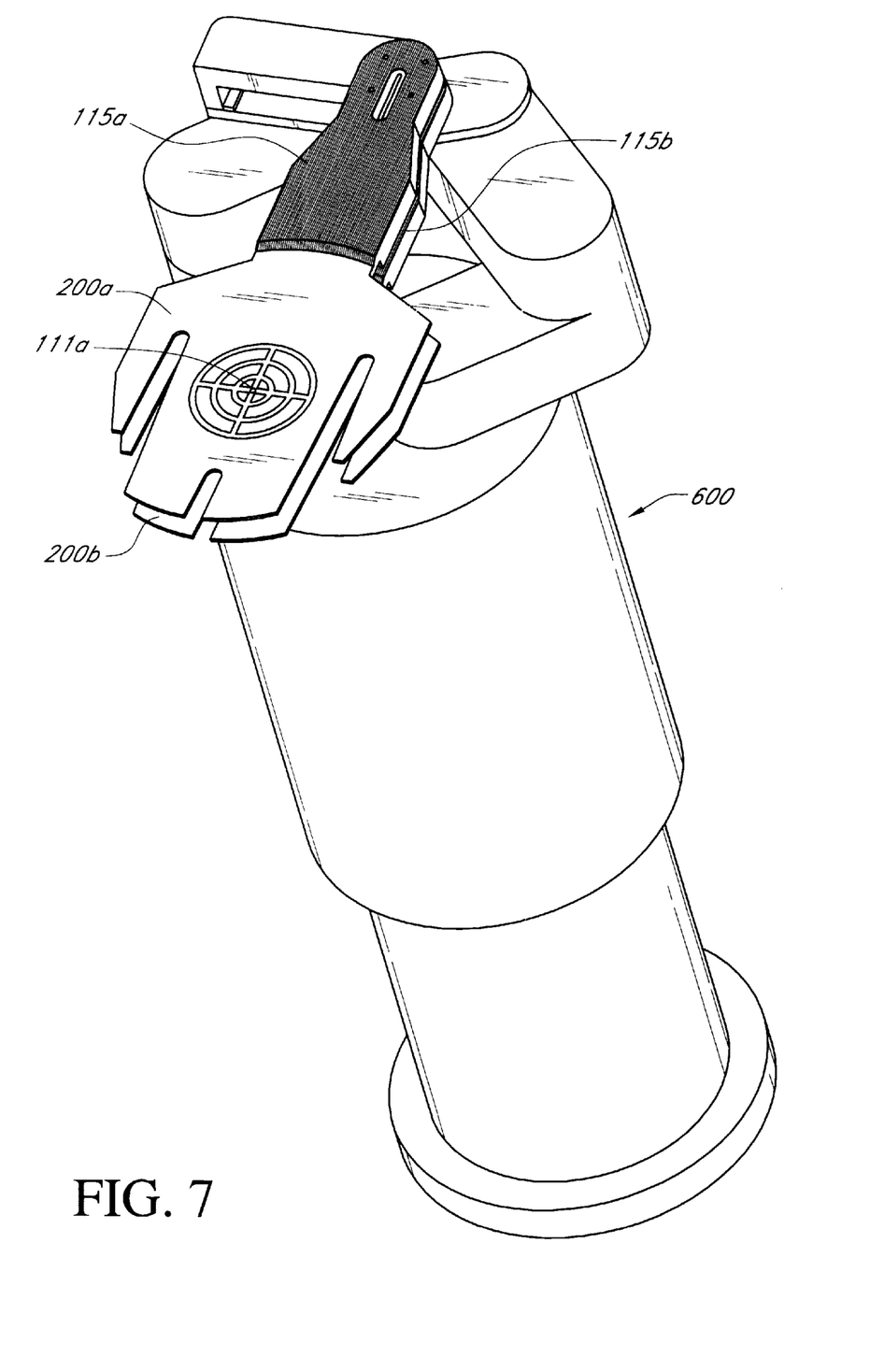
FIG. 7 illustrates a robot incorporating two end-effectors, each similar to the end-effector shown in FIG. 2.

With reference to FIG. 7, a dual arm robot preferably in accordance with another embodiment is configured so that the two end-effectors alternately handle hot processed wafers. It will be readily appreciated that the dual arm robot will generally benefit cluster tools comprising multiple process chambers. FIG. 7 shows a dual arm robot 600 comprising an upper end-effector 200a and a lower end-effector 200b. Both end-effectors 200a and 200b comprise cooling fins 115a, 115b, which promote cooling of the end-effectors by convection as described in the above embodiment, as well as vacuum ports 111a to promote cooling of the wafers by conduction.

The first end-effector 200a, for example, picks a first cold wafer from a cassette after just having placed a first hot wafer (preferably from a first process chamber) into the cassette. Picking up the first cold wafer thus cools the end-effector 200a and conversely pre-heats the first cold wafer in a thermal exchange. In the time it takes for the first end-effector 200a to cool, the second end-effector 200b picks up a second hot wafer (preferably from an adjacent second process chamber) and carries it to the cassette, in the meantime cooling the second hot wafer and heating the paddle portion of the second end-effector 200b. The second end-effector 200b picks up a second cold wafer from the cassette, cooling the end-effector 200b and pre-heating the new wafer. While the second end-effector 200b cools, the first end-effector 200b picks up the next hot wafer (preferably from the first process chamber).

The robot controller (not shown) is thus programmed so that the end effectors 200a and 200b are sufficiently cooled before alternatingly picking hot wafers. Advantageously, the dual arm robot further improves wafer throughput by reducing the cooling overhead between each processed wafer. In the preferred embodiment comprising an alternating dual arm robot, a wafer can be cooled from about 250° C. to less than about 100° C. in about 5 seconds, i.e., in the time it takes to complete transfer from the chamber to the cassette.

Whether utilizing single or dual arm robots, other heat transferring mechanisms can be substituted or added to the end-effectors 100, 200a, 200b of FIGS. 2 or 7. Most preferably, the end-effector comprises a heat sink and internal mechanisms for active cooling of the end-effector.

Figure 3:
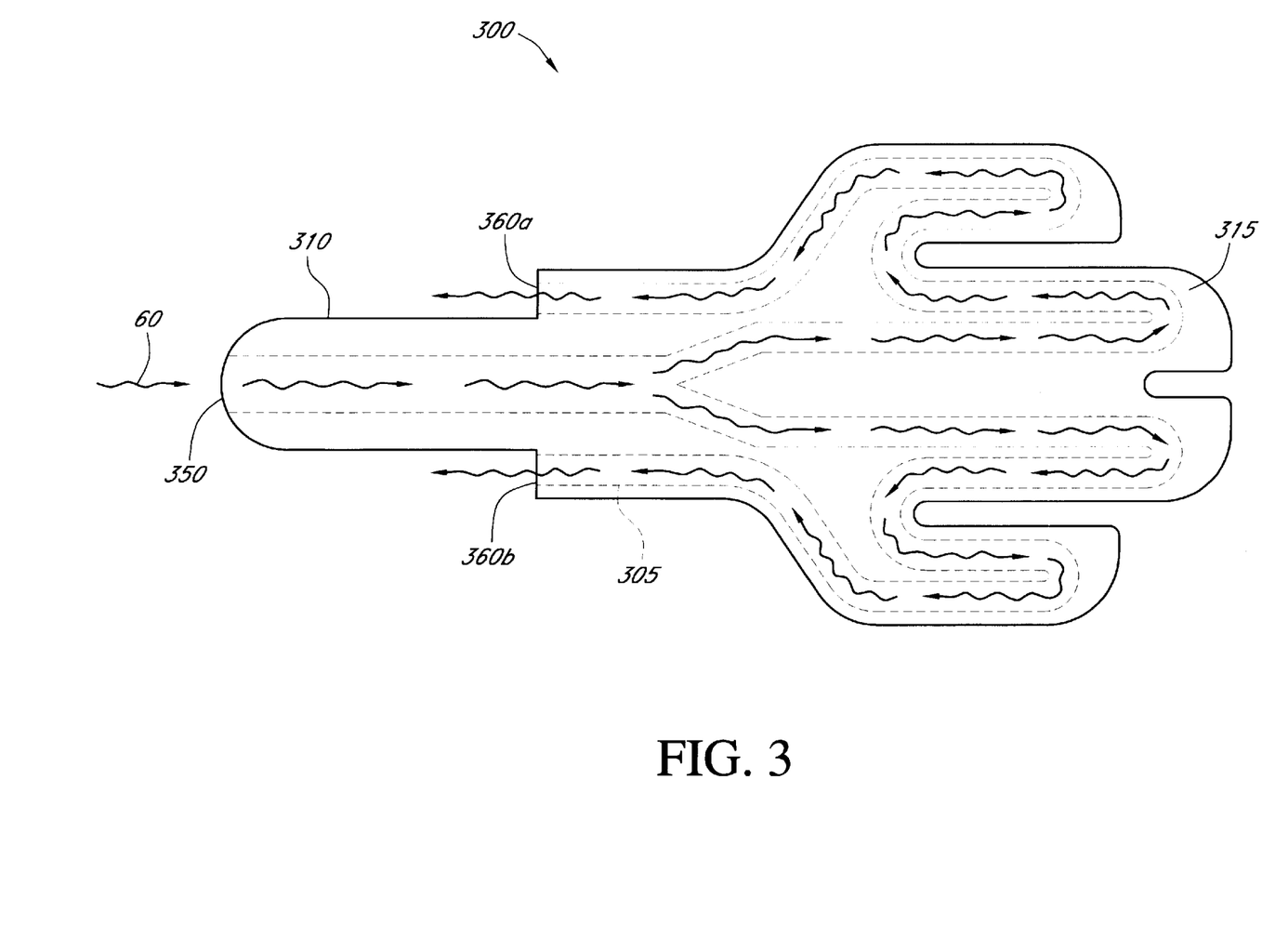
FIG. 3 is a schematic plan view of an end-effector constructed in accordance with another embodiment of the present invention.

For example, in another embodiment, FIG. 3 shows an end-effector 300 with imbedded cooling channels 305. The cooling channels 305 advantageously communicate with a circulation system (not shown) circulating a coolant fluid such as air, water, liquid nitrogen, etc., to effectively remove heat energy by convection from the paddle portion 315 and handle 310. Similar to the above-mentioned end-effector 100 with cooling fins 105, the end-effector 300 with cooling channels 305 rapidly cools processed wafers by actively drawing heat energy away from the paddle portion 315 and the end-effector 300.

A cooling fluid, preferably comprising cold air 60 in the illustrated embodiment, enters an input port 350 in the handle 310 of the end-effector 300. The cold air 60 circulates through the network of cooling channels 305 distributed through the paddle portion 315 and exits through output ports 360a and 360b. It should be generally understood that the network of cooling channels 305 shown in FIG. 3 are for illustrative purposes and can vary in design according to cooling needs. The cooling channels can be manufactured by techniques known by those skilled in the art such as aluminum vacuum brazing grooves on the underside of the paddle 315 and the heat sink 310 and bonding pre-fabricated tubes within the grooves or caps covering the grooves. It will be understood that the coolant circulating through the cooling channels 305 can comprise a gas, such as air, helium or argon, or a liquid, such as water.

Figure 4:
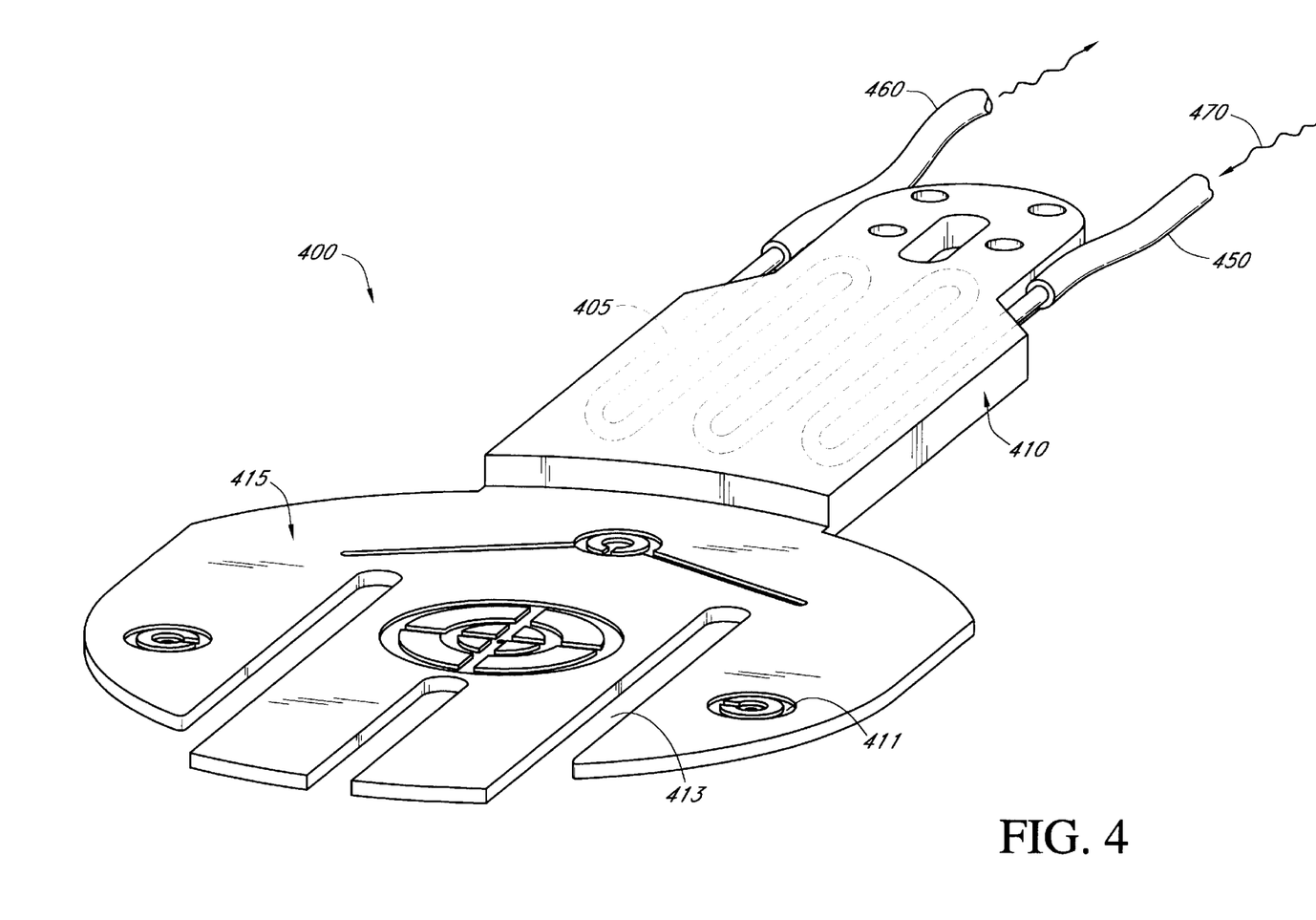
FIG. 4 is top and right perspective view of an end-effector constructed in accordance with still another embodiment of the present invention.

In yet another embodiment, FIG. 4 shows an end-effector 400 with fluid channels 405 extending only through a handle or heat sink portion 410. In the illustrated embodiment, the handle portion 410 has a greater thickness, relative to the paddle portion 415, as described with respect to FIGS. 1, 2 and 7. In place of cooling fins, the cooling channels 405 serve as an active heat dissipation mechanism. The channels 405 are preferably embedded in the upper portion of the heat sink 410, simplifying the provision of vacuum passages in the lower portions of the end-effector 400. The vacuum passages lead to vacuum ports 411 in the upper surface of the paddle portion 415, promoting intimate contact between the wafer and the end-effector 400. The fluid channels 405 similarly promote active and rapid cooling of the end-effector 400 by fluid convection. Heat energy absorbed by the paddle 415 will naturally conduct to the heat sink 410, and subsequently dissipate through coolant fluid that circulates through the fluid channels 405.

In the illustrated embodiment, a coolant fluid such as water, liquid nitrogen, etc., preferably enters an input port 450. The coolant fluid, preferably water 470, circulates through the fluid channels 405 and exits through an output port 460. The illustrated layout of the fluid channels 405 is exemplary and can be vary in design according to the cooling needs. Within the thickened heat sink portion 410, the embedded channels 405 can be manufactured by machining or aluminum vacuum brazing the channels.

Figure 5:
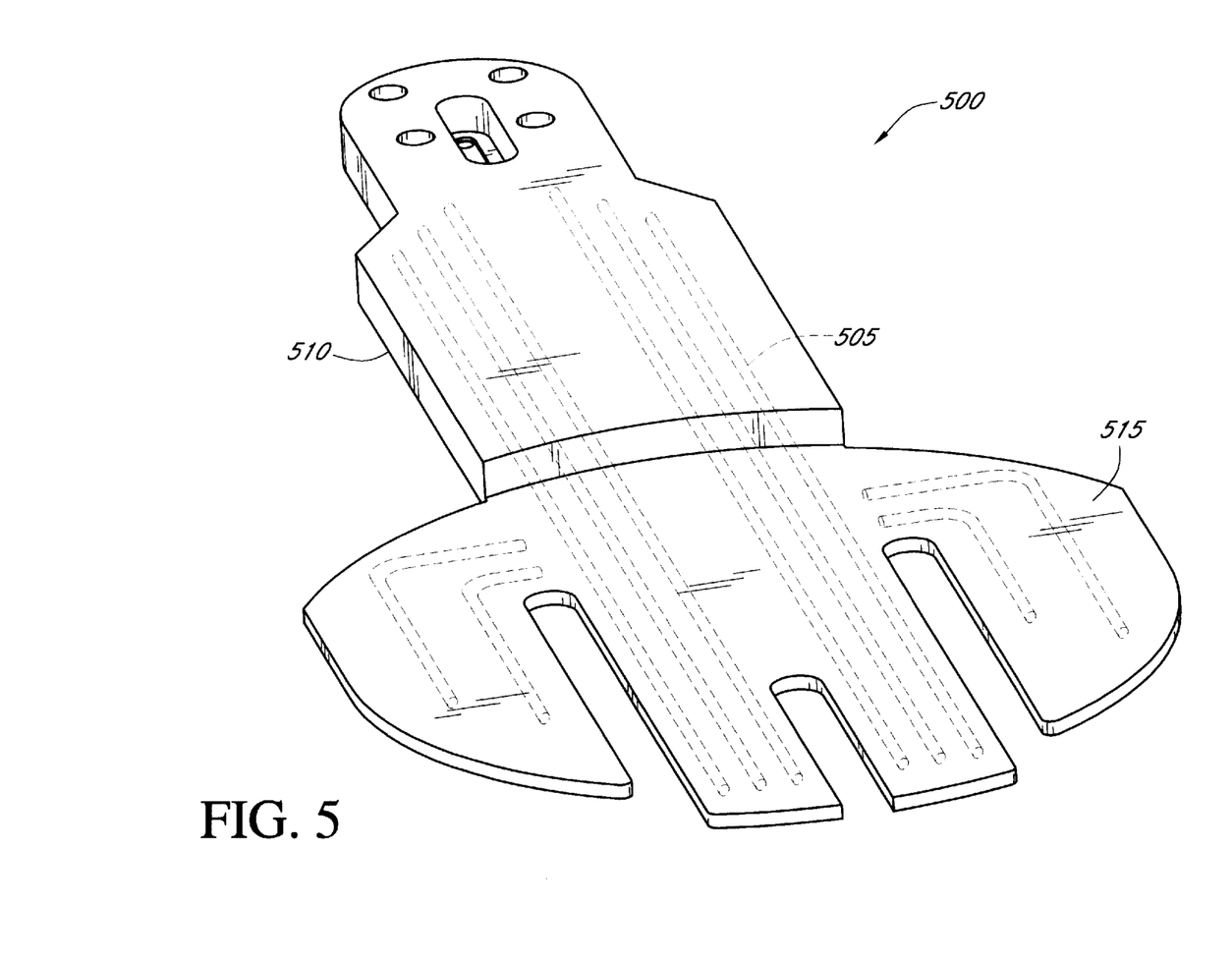
FIG. 5 is a top and left perspective view of an end-effector constructed in accordance with still another embodiment of the present invention.

In yet another embodiment, FIG. 5 shows an end-effector 500 with enclosed fluid channels in the form of heat pipes 505. The heat pipes 505 contain a fluid that provides a thermal channel for absorbed heat energy to communicate from the paddle portion 515 to the heat sink 510 of the end-effector 500. The heat pipes 505 advantageously promote heat transfer from the paddle portion 515 to the heat sink 510, to be subsequently dissipated at the heat sink 510.

In the illustrated embodiment, the heat pipes 505 extend along the underside of the end-effector 500. As will be appreciated by the skilled artisan, the heat pipes 505 are enclosed channels housing a phase transition material that vaporizes at the hotter end and condenses at the cooler end, thus actively and convectively transferring heat between the paddle portion 515 and the heat sink 510. Exemplary heat pipes are commercially available from Noren Products, Inc. of Menlo Park, Calif., and in the illustrated embodiment measure 5 mm by 2 mm in cross section. The heat pipes preferably comprise a thermally conductive metal shell, particularly copper, and can vary in length along the end effector 500. In the preferred embodiment, the heat pipes 505 extend from the paddle portion 515 to the heat sink 510, preferably extending greater than about 70% the length of the end-effector 500.

Accordingly, several objects and advantages inhere in the described invention. For example, eliminating an intermediate cooling step such as a cooling station reduces cooling overhead of processed wafers, thereby improving wafer throughput. Moreover, the end-effectors can be preferably configured with dual-arm robots to further reduce cooling overhead, thereby further improving wafer throughput. Also, the end-effectors comprise integrated heat transferring mechanisms that eliminate the need for outside cooling agents, thus minimizing particulate contamination of the process environment.

It will be appreciated by those skilled in the art that various modifications and changes may be made without departing from the scope of the invention, and all such modifications and changes are intended to fall within the scope of the invention, as defined by the appended claims.

I claim:

1. An end-effector for transporting substrates within a semiconductor fabrication environment:

the end-effector comprising a paddle portion configured to underlie at least 60% of a substrate and thereby support and conductively exchange heat with the substrate;

a handle portion in conductive thermal contact with the paddle portion, the handle portion configured to connect the paddle portion to a robot arm; and an integrated cooling mechanism configured to dissipate heat from the end-effector by convection, wherein the integrated cooling mechanism comprises a plurality of surface area enhancing fins projecting from the handle portion.

2. The end-effector of claim 1, wherein an upper surface area of the handle portion, including the fins, is at least twice an area of an upper surface of the paddle portion.

3. The end-effector of claim 2, wherein the upper surface area of the handle portion, including the fins, is between about two times and three times the area of the upper surface of the paddle portion.

4. The end-effector of claim 1, connected to a substantially identical second end-effector on a single substrate handling robot.

5. The end-effector of claim 4, wherein the robot is configured to alternately handle processed substrates with the end-effector alternatingly with the second end-effector.

6. The end-effector of claim 5, wherein the thickness of the handle portion is between about 3 and 4 times the thickness of the paddle portion.

7. The end-effector of claim 1, wherein the handle portion has a thickness in a vertical dimension at least about 2 times a corresponding thickness of the paddle portion.

8. The end-effector of claim 1, wherein the paddle portion has an upper surface of at least 80% of a substrate surface.

9. The end-effector of claim 1, wherein the handle portion has a width at least about one-quarter a corresponding width of the paddle portion.

10. A method for cooling processed substrates with a dual arm robot, the method comprising:

removing a first hot substrate from a first process chamber with a first end-effector;

transferring heat from the first hot substrate to the first end-effector;

moving the first hot substrate to a first storage cassette with the first end-effector;

removing a second hot substrate from a second, different process chamber with a second end-effector, wherein the first and second process chambers comprise photoresist ashing reactors;

transferring heat from the second hot substrate to the second end-effector;

cooling the first end-effector while transferring heat from the second hot substrate to the second end-effector; and moving the second hot substrate to a second storage cassette with the second end-effector.

11. The method of claim 10, wherein moving the first hot substrate comprises carrying the first hot substrate directly from a process chamber to the first storage cassette while transferring heat from the first hot substrate.

12. The method of claim 10, wherein transferring heat from the first hot substrate comprises conductively transferring heat from the first hot wafer to a paddle of the first end-effector underlying more that about 60% of the first hot substrate.

13. The method of claim 10, further comprising picking up a first cold substrate with the first end-effector after moving the first hot substrate to the first storage cassette.

14. The method of claim 13, wherein cooling the first end-effector comprises transferring heat from the first end-effector to the first cold substrate.

15. The method of claim 10, wherein picking up the first hot substrate comprises removing the first hot substrate from a first process chamber and picking up the second hot substrate comprises removing the second hot substrate from second, different process chamber.

16. The method of claim 10, further comprising repeatedly picking up hot substrates with the first end-effector alternatingly with picking up hot substrates with the second end-effector.

17. An end-effector for transporting substrates, comprising:

a paddle portion configured to support a substrate, the paddle portion having a support surface having a surface area greater than about 60% of the substrate surface; and a handle portion integrally extending from the paddle portion, the handle portion having a plurality of projections on a surface thereof, wherein the surface area of the projections is greater than about three times the surface area of the support surface.

18. The end-effector of claim 12, wherein the projections comprise a plurality of fins.

19. The end-effector of claim 12, further comprising at least one vacuum port in the support surface of the paddle portion.

20. A method of handling substrates between a storage area and a high temperature processing chamber, comprising:

removing a first substrate from a high temperature processing chamber with a substrate handler having a paddle portion in thermal contact with a handle portion, the handle portion connecting the paddle portion to a robot arm;

conductively transferring heat from the substrate to the paddle portion;

transferring heat from the paddle portion to the handle portion; and actively dissipating heat from the handle portion by forced convection, wherein actively dissipating heat comprises providing a plurality of projections upon the handle portion, the projections having a surface area more than twice an upper surface of the paddle portion, and moving the substrate handler.

21. The method of claim 20, further comprising carrying the processed substrate directly from the processing chamber to the storage area and dropping the processed substrate at the storage area, wherein conductively transferring, transferring and actively dissipating are conducted while moving the substrate handler.

22. The method of claim 21, further comprising removing an unprocessed wafer from the storage area after dropping the processed substrate and transferring heat from the paddle portion to the unprocessed substrate.

* * * * *